US012683548B2

(12) United States Patent
Fleischer et al.

(10) Patent No.: US 12,683,548 B2
(45) Date of Patent: Jul. 14, 2026

(54) DECOUPLING OF A PEROVSKITE SOLAR CELL IN DARKNESS

(71) Applicant: Siemens Energy Global GmbH & Co. KG, Munich (DE)

(72) Inventors: Maximilian Fleischer, Hohenkirchen (DE); Roland Pohle, Herdweg (DE); Elfriede Simon, Munich (DE); Oliver von Sicard, Munich (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 121 days.

(21) Appl. No.: 17/788,894

(22) PCT Filed: Dec. 11, 2020

(86) PCT No.: PCT/EP2020/085664
§ 371 (c)(1),
(2) Date: Jun. 24, 2022

(87) PCT Pub. No.: WO2021/144085
PCT Pub. Date: Jul. 22, 2021

(65) Prior Publication Data
US 2023/0042945 A1     Feb. 9, 2023

(30) Foreign Application Priority Data
Jan. 15, 2020     (EP) ..................................... 20152041

(51) Int. Cl.
*H01L 31/00*          (2006.01)
*H02S 50/00*          (2014.01)
(Continued)

(52) U.S. Cl.
CPC .............. *H02S 50/00* (2013.01); *H02S 50/10* (2014.12); *H10F 19/31* (2025.01); *H10K 30/57* (2023.02);
(Continued)

(58) Field of Classification Search
CPC ....... H01L 31/046; H02S 50/10; H10K 71/00; H10K 71/421
See application file for complete search history.

(56) References Cited

U.S. PATENT DOCUMENTS

2007/0027644 A1     2/2007   Bettenwort et al.
2008/0236648 A1*   10/2008   Klein ...................... H02S 40/36
                                                                                   320/101
(Continued)

FOREIGN PATENT DOCUMENTS

EP          1750193 B1     1/2019
EP          2360546 B1     10/2019
(Continued)

OTHER PUBLICATIONS

Pockett et al., "Characterization of Planar Lead Halide Perovskite Solar Cells by Impedance Spectroscopy, Open-Circuit Photovoltage Decay, and Intensity-Modulated Photovoltage/Photocurrent Spectroscopy", J. Phys. Chem. C 2015, 119, 3456-3465. (Year: 2015).*
(Continued)

*Primary Examiner* — Thanh Truc Trinh
(74) *Attorney, Agent, or Firm* — Wolter Van Dyke Davis, PLLC

(57)          ABSTRACT
A method for operating a photovoltaic module in which the photovoltaic module has at least one perovskite solar cell. The method includes temporarily operating the photovoltaic module at the maximum power point by a control device connected to the photovoltaic module, wherein the drawing of electrical energy is interrupted when the irradiance of electromagnetic radiation impinging on the photovoltaic module falls below a predetermined threshold value. A photovoltaic device includes a photovoltaic module having at least one perovskite solar cell, and a control device connected to the photovoltaic module.

11 Claims, 2 Drawing Sheets

(51) Int. Cl.

| | |
|---|---|
| *H02S 50/10* | (2014.01) |
| *H10F 19/31* | (2025.01) |
| *H10K 30/57* | (2023.01) |
| *H10K 71/40* | (2023.01) |
| *H10K 85/50* | (2023.01) |
| *H10K 39/10* | (2023.01) |

(52) U.S. Cl.

CPC ........... *H10K 71/421* (2023.02); *H10K 85/50* (2023.02); *H10K 39/10* (2023.02)

(56) References Cited

U.S. PATENT DOCUMENTS

| | | | |
|---|---|---|---|
| 2012/0118348 A1* | 5/2012 | Buller ............... | H01L 31/02021 136/244 |
| 2013/0027020 A1 | 1/2013 | Klein et al. | |
| 2014/0266288 A1* | 9/2014 | Trabacchin ............. | H02J 3/381 324/761.01 |
| 2017/0040557 A1* | 2/2017 | Bailie ................... | H10K 85/50 |
| 2018/0259990 A1 | 9/2018 | Pellet et al. | |
| 2022/0052639 A1 | 2/2022 | Fleischer et al. | |

FOREIGN PATENT DOCUMENTS

| | | | |
|---|---|---|---|
| WO | WO 2005/069096 | * | 7/2005 |
| WO | 2016164718 A1 | | 10/2016 |

OTHER PUBLICATIONS

PCT International Search Report and Written Opinion of International Searching Authority mailed Mar. 23, 2021 corresponding to PCT International Application No. PCT/EP2020/085664 filed Dec. 11, 2020.

* cited by examiner

DECOUPLING OF A PEROVSKITE SOLAR CELL IN DARKNESS

CROSS REFERENCE TO RELATED APPLICATIONS

This application is the US National Stage of International Application No. PCT/EP2020/085664 filed 11 Dec. 2020, and claims the benefit thereof. The International Application claims the benefit of European Application No. EP20152041 filed 15 Jan. 2020. All of the applications are incorporated by reference herein in their entirety.

TECHNICAL FIELD

The invention relates to a method for operating a photovoltaic module having at least one perovskite solar cell. Furthermore, the invention relates to a photovoltaic device comprising a photovoltaic module having at least one perovskite solar cell and a regulation device connected to the photovoltaic module.

BACKGROUND OF INVENTION

Photovoltaic modules are typically operated in a photovoltaic installation by means of maximum power point tracking (MPPT). This is an electrical engineering method in which the electrical loading of the photovoltaic module is regulated in such a way that the maximum power is withdrawn from the photovoltaic module. The optimum operating point of the photovoltaic module is not constant over time, but is dependent on parameters such as, for example, the irradiance, the irradiation spectrum and the temperature of the solar cells of the photovoltaic module. The type of solar cells used (for example monocrystalline/multicrystalline/amorphous silicon) also has an influence on where the optimum operating point is. The optimum operating point is generally continuously adjusted.

Maximum power point tracking is an established method for maximizing the withdrawn power for photovoltaic modules having crystalline silicon solar cells.

In order to perform the maximum power point tracking method for a photovoltaic module, typically a regulation device is connected to the photovoltaic module (or a string of photovoltaic modules). The regulation device presets a resistance, which is also referred to as load resistance. The load resistance is set in such a way that it corresponds to that internal resistance of the photovoltaic module at which the power of the photovoltaic module is at a maximum. The photovoltaic module is in this case operated with power matching in respect of the regulation device.

A challenge of the MPPT method consists in determining the optimum operating point reliably and with as little consumption of energy as possible. This is not trivial, for example, in the case of partial shadowing of the photovoltaic installation since in this case, under certain circumstances, only a local power maximum instead of the global power maximum is determined by the regulation device. Corresponding approaches to solving the problem of most reliable as possible determination of the global power maximum of a photovoltaic module or a photovoltaic installation are disclosed, for example, in the patent specifications EP 1 750 193 B1 or EP 2 360 546 B 1.

In any case, the photovoltaic module needs to be connected continuously to the regulation device, however, in order to still withdraw the maximum electrical power even in the case of diffuse solar radiation onto the photovoltaic module, for example in the case of cloud cover or twilight. At night, the photovoltaic module remains connected to the regulation device even when no power can be withdrawn from the photovoltaic module in the case of full darkness.

For many years, perovskites, such as, for example, $CH_3NH_3PbI_3$, have been investigated in respect of their usability in solar cells. Owing to their optoelectronic properties, they in principle allow high-efficiency conversion of electromagnetic radiation energy into electrical energy. Perovskite-based solar cells, also referred to below as perovskite solar cells, are firstly characterized by the fact that they are comparatively inexpensive to manufacture. Secondly, perovskite solar cells represent an attractive and serious alternative to conventional silicon-based solar cells because, owing to the advances that have rapidly been made in recent years in terms of their efficiency from a few percent to over 25% nowadays, it becomes apparent that efficiencies can be achieved which significantly surpass those of conventional silicon solar cells. In this case, it is conceivable for a perovskite solar cell to be operated alone or else in a tandem photovoltaic module, for example in combination with a crystalline silicon solar cell.

Photovoltaic modules having perovskite solar cells are currently at least not yet commercially available. Correspondingly, there is also as yet no knowledge of the optimum operation of a photovoltaic module having perovskite solar cells.

WO 2016/164718 describes a controller for PV systems in which an irradiance value is ascertained. A threshold value is also defined. When the threshold value is undershot, the PV system can be disconnected from the electrical load. The power output by the PV system is monitored/predicted here, that is to say changes (in the series resistance) are monitored. For this measurement, the cell must supply power and the appropriate irradiation is required.

US 2018/259990 A1 likewise discloses a controller of a perovskite PV cell.

Against this background, the present invention has the set object of developing a concept for developing an efficient operating method for the operation of a photovoltaic module which contains one or more perovskite solar cells.

SUMMARY OF INVENTION

Over the course of their own investigations, the Applicant has surprisingly established that perovskite solar cells degrade severely when they are loaded by means of MPPT without illumination, for example at night, for a relatively long period of time. Even in the case of illumination with only a low intensity a degradation could be measured under certain circumstances.

The reasons for the degradation of a photovoltaic module which contains one or more perovskite solar cells and is operated by means of maximum power point tracking in the case of low levels of illumination or no illumination at all are at present still unclear. The physical/chemical effects which lead to the observed degradation have at present not yet been clarified beyond doubt.

A markedly improved method for operating a photovoltaic module which contains one or more perovskite solar cells is the following method in accordance with the invention, however: The method comprises the at least temporary operation of the photovoltaic module at the maximum power point by means of a regulation device connected to the photovoltaic module. The withdrawal of electrical energy is in this case interrupted when the irradiance of an electromagnetic radiation impinging on the photovoltaic falls below a predetermined threshold value.

Of course, the perovskite photovoltaic module generally has more than one perovskite solar cell, namely a multiplicity of perovskite solar cells. A perovskite solar cell can also be part of a tandem cell, which is constructed from a perovskite solar cell and a further solar cell, for example a conventional silicon solar cell. For such tandem solar cells, on a laboratory scale recently an impressive efficiency of 28% has been achieved.

The photovoltaic module is operated at the maximum power point by means of the regulation device in particular substantially throughout the time period in which the irradiance exceeds the predetermined threshold value.

This means that the photovoltaic module is operated at the maximum power point by means of the regulation device advantageously when the irradiance exceeds the predetermined threshold value, and the energy withdrawal is interrupted when the irradiance falls below the predetermined threshold value.

The regulation device is in particular an inverter which is assigned to the photovoltaic module and which is in particular provided with a settable load resistance. In this case, the inverter can be assigned to a single photovoltaic module (such an inverter is also referred to as a microinverter in technical speak) or a whole string of photovoltaic modules. Theoretically, one individual inverter per solar cell is also conceivable.

Since the loading of the photovoltaic module is set on the basis of the load voltage, but the output voltage of the regulation device should be virtually constant, in general a DC-DC converter is used in order to be able to set the voltage differences and therefore the loading of the solar cell. The continuous adjustment of the optimum operating point of the photovoltaic module (namely the operation of the photovoltaic module at the maximum power point) is advantageously specifically performed by a microcontroller or a digital signal processor. In this case, the required measurement data can be made available to the processor by an analog-to-digital converter. The analog-to-digital converter can then perform the required calculations and pass on the result to the DC-DC converter by means of pulse width modulation.

The regulation device can also be a so-called "power optimizer" assigned to the photovoltaic module.

According to the invention, the withdrawal of electrical energy is interrupted when the irradiance of the electromagnetic radiation impinging on the photovoltaic module falls below a predetermined threshold value. The withdrawal of electrical energy is understood to mean the withdrawal of electrical energy from the photovoltaic module. When there is a regulation device connected, this withdrawal is controlled by the regulation device, to be precise in such a way that the amount of energy withdrawn is ideally always as high as possible.

The photovoltaic module is electrically decoupled from the regulation device when the irradiance falls below the predetermined threshold value. The circuit on which the photovoltaic module is dependent is thus open and the open circuit voltage is present at the photovoltaic module.

The decoupling or the disconnection of the photovoltaic module from the regulation device can in practice be implemented simply by disconnecting the electrical contact (in other words by electrical isolation) of the regulation device from the photovoltaic module. For this purpose, the temporary disconnection of the photovoltaic module from the regulation device can take place electronically, for example by means of a transistor which is subject to high-resistance control. If, for example, a metal-oxide-semiconductor field-effect transistor (MOSFET) is used, no notable energy would need to be used for controlling the transistor. The use of a transistor has the advantage over the use of a mechanical switch that no movable parts are involved, and it is therefore maintenance-free and has a long life. Since no electrical voltage can be withdrawn from the photovoltaic module on activation of the switch/transistor, the withdrawable electrical power from the photovoltaic module (or correspondingly the withdrawable electrical energy) is also equal to zero.

According to the invention, the withdrawal of electrical energy is interrupted when the irradiance is less than a predetermined threshold value. This threshold value is in particular in the range of between 2 W/m² and 20 W/m², advantageously between 5 W/m² and 15 W/m², and particularly advantageously 10 W/m². According to some measurements specifically on perovskite solar cells, it has surprisingly been found that they also function very well and do not exhibit degradation even at a few W/m². A threshold value in one of these ranges corresponds to a weak or very weak illumination of the perovskite solar cell(s). The fixing of the threshold value in one of these ranges is advantageous because the degradation of the perovskite solar cell, in particular the reduction in its efficiency, has been observed precisely in the case of no or (very) weak illumination in conjunction with a connected MPPT regulation device.

When the irradiance falls below the predetermined threshold value, the photovoltaic module is advantageously electrically short-circuited. This can also be implemented by a corresponding switch, relay or transistor which in this case electrically conductively connects the two electrical contacts (front and rear contact or p-/n-contact) of the photovoltaic module. Since no electrical current flow can be withdrawn from the photovoltaic module in this case, the withdrawable electrical power (or correspondingly the electrical energy) is also equal to zero here.

The irradiance is understood to mean the total power of the incoming electromagnetic energy which impinges on a surface, based on the size of the area. In other words, the irradiance is therefore the radiant flux through the irradiated area. It is also referred to as radiant flux density.

For example, the photocurrent generated by the photovoltaic module can be used as a measure of the irradiance of the electromagnetic radiation impinging on the photovoltaic module. This has the advantage that the photocurrent is generally in any case detected using measurement technology and therefore appears to be suitable as the control variable with respect to the disconnection or the electrical connection of the regulation device from/to the photovoltaic module. Instead of the photocurrent, under certain circumstances (in the case of known and temporally stable module efficiency) the output power of the photovoltaic module could also be used as a measure of the irradiance.

As an alternative, the irradiance can also be determined by means of impedance spectroscopy at one or, if present, more perovskite solar cells of the photovoltaic module.

In the case of impedance spectroscopy, in particular electrochemical impedance spectroscopy, an AC voltage is applied to the perovskite solar cell, and the resultant current flow is measured for various frequencies of the AC voltage. On the basis of a suitable plotting of the measurement results, for example in a so-called Bode or Nyquist plot, conclusions can then be drawn on internal parameters of the perovskite solar cell, for example charge carrier transport or recombination rate of the charge carriers. By means of the values of suitable internal parameters, it is also possible in particular to draw conclusions on the irradiance of the solar cell under investigation.

A further possible way of determining the irradiance of the electromagnetic radiation impinging on the photovoltaic module is the provision of an additional photoelectric cell, by means of which the irradiance is determined. Specifically, the irradiance can in this case be determined, for example, by means of the photocurrent generated by the additional photoelectric cell.

The additional photoelectric cell can be dimensioned so as to be relatively small (for example 1×1 cm²) and is advantageously integrated in the photovoltaic module. It can be integrated, for example, in the frame, i.e. at the rim of the photovoltaic module.

Yet a further possible way of estimating the irradiance of the solar radiation impinging on the photovoltaic module is that of recourse to meteorological data. Sunrise and sunset for a specific location on the Earth over the course of the year (i.e. for each day) are known and can be programmed into the regulation device, for example, after knowledge of the location of the photovoltaic module. This has the advantage that no measurement data for regulation with respect to the disconnection or connection of the regulation device need to be raised and processed. However, such a method is also less precise since cloud cover or shadowing of the photovoltaic module or part of it can therefore not be detected and taken into consideration.

Finally, the inventive concept can also be used in a photovoltaic device. The photovoltaic device comprises a photovoltaic module having at least one perovskite solar cell and a regulation device connected to the photovoltaic module. The regulation device is configured to operate the photovoltaic module at least temporarily at the maximum power point but to interrupt the energy withdrawal when the irradiance of an electromagnetic radiation impinging on the photovoltaic falls below a predetermined threshold value.

BRIEF DESCRIPTION OF THE DRAWINGS

The invention will be illustrated below with reference to the attached figures, in which.

DETAILED DESCRIPTION OF THE INVENTION

Figure 1:
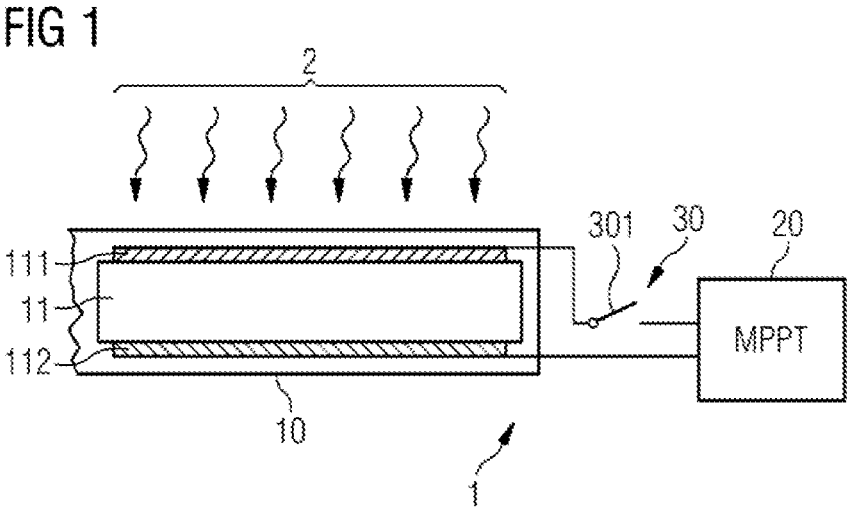
FIG. 1 shows a photovoltaic module, which is electrically decoupled from a regulation device so that the withdrawal of electrical energy is interrupted.
Figure 2:
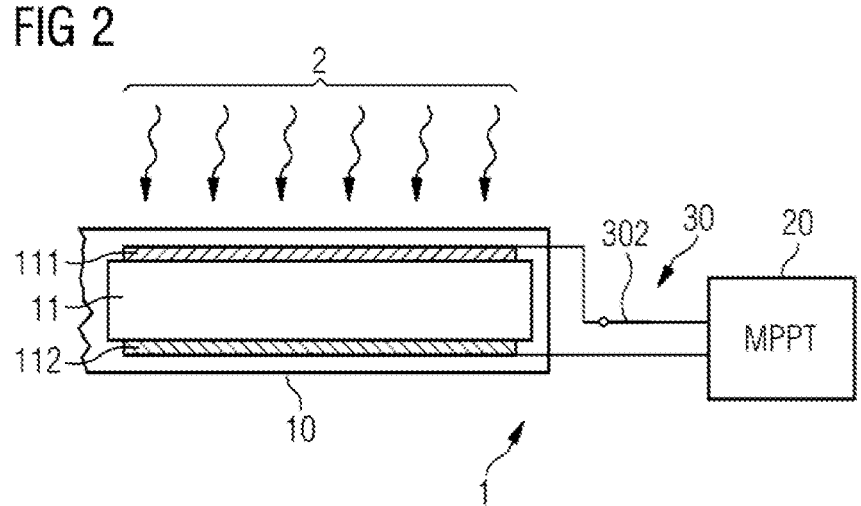
FIG. 2 shows the same photovoltaic module, which is now electrically connected to the regulation device so that the photovoltaic module can be operated at the maximum power point.
Figure 3:
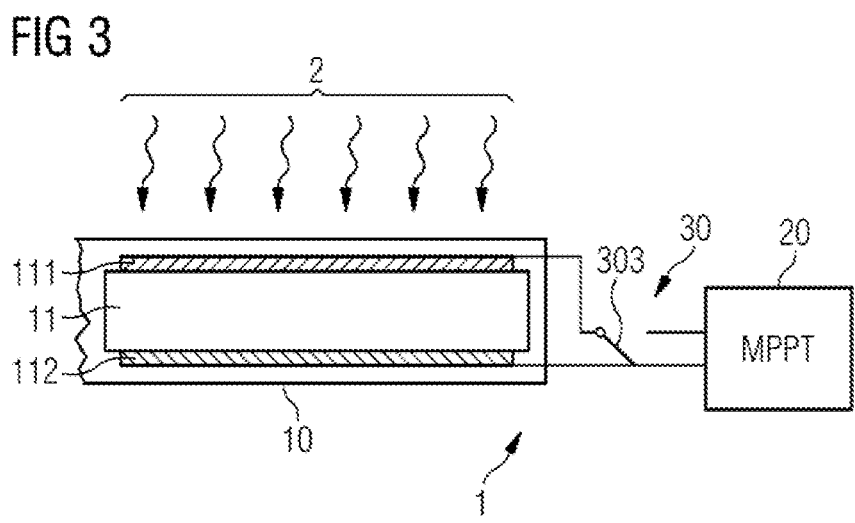
FIG. 3 shows the same photovoltaic module, which is now short-circuited.

FIGS. 1 to 3 (also referred to as FIGS. 1 to 3) show an exemplary embodiment of a photovoltaic device 1 according to the invention. The photovoltaic device 1 has a photovoltaic module 10 having a multiplicity of perovskite solar cells 11, of which only one is shown in FIG. 1 for reasons of clarity. Each of the perovskite solar cells 11 has an electron transport layer, a light-absorbing layer (also referred to as "absorber") and a hole transport layer. The absorber contains a perovskite having the general structural formula $ABX_3$, where, for example, $A=CH_3NH_3$, $B=Pb$ and $X=I_3$. Furthermore, the solar cell has a front contact 111 and a rear contact 112. The front contact 111 is advantageously transparent to electromagnetic radiation from a specific wavelength range for which the solar cell is designed. The rear contact can be configured to cover the full area and to be non-transparent (for example comprising an aluminum alloy). The perovskite solar cells 11 are embedded in glass sheets which are intended to protect it from, for example, contamination and damage.

FIGS. 1 to 3 also show electromagnetic radiation 2 of the Sun (also referred to as "solar radiation") which impinges on the front of the photovoltaic module 10 and therefore also on the front of the perovskite solar cell 11.

The front and rear contacts 111, 112 of the solar cell 11 shown in FIG. 1 are electrically conductively connectable to a regulation device 20. The photovoltaic module 10 can namely be electrically connected to or electrically decoupled from the regulation device 20 by means of a switch 30. In addition, the photovoltaic module 10 can also be short-circuited by means of the switch 30.

FIG. 1 shows a sketch of a first position 301 of the switch 30. In the first position 301, the switch is open and the photovoltaic module 10 is electrically disconnected from the regulation device 20. Therefore, an open circuit voltage is present at the photovoltaic module 10. No energy is withdrawn from the photovoltaic module 10.

FIG. 2 shows a sketch of a second position 302 of the switch 30. In the second position 302, the switch is closed and the electrical connection between the photovoltaic module 10 and the regulation device 20 has been produced. The regulation device 20 is capable of withdrawing the maximum power (or correspondingly the maximum energy) from the photovoltaic module by virtue of matching its load resistance to the currently present internal resistance of the photovoltaic module.

FIG. 3 shows a sketch of a third position 303 of the switch 30. In the third position 303, the switch connects the front contact 111 and the rear contact 112 of the photovoltaic module 10 and therefore short-circuits the latter. A corresponding short-circuit current flows at the photovoltaic module 10, and it is not possible for any energy to be withdrawn from the photovoltaic module 10 either.

In particular, the regulation device 20 itself can set the switch 30 into the respectively appropriate position 301, 302, 303. When the irradiance is sufficiently high, the switch is closed (position 302) and maximum power point tracking of the photovoltaic module 10 takes place. However, if the irradiance falls below a predetermined threshold value, the photovoltaic module 10 is either decoupled from the regulation device (position 301) or short-circuited. In both cases, the result is that maximum power point tracking of the photovoltaic module by means of the regulation device 20 is no longer possible, and therefore degradation of the perovskite solar cell(s) 11 of the photovoltaic module 10 is prevented or at least reduced.

Figure 4:
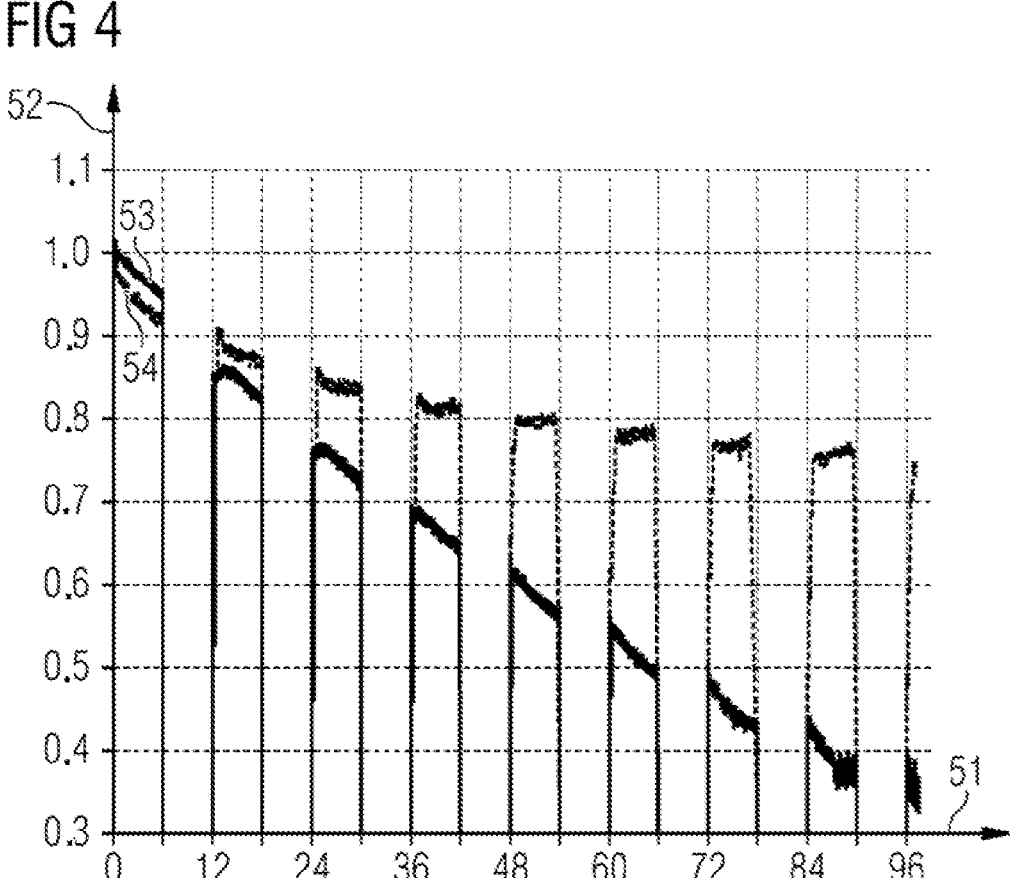
FIG. 4 shows the developments of the efficiencies of two perovskite solar cells over time.

FIG. 4 (also referred to as FIG. 4) shows the characteristic of the efficiency of a first perovskite solar cell 53 over time and the characteristic of the efficiency of a second perovskite solar cell 54 over time. The time in hours is plotted on the x axis 51, and the standardized efficiency is plotted on the y axis 52. The efficiency is plotted in standardized form, i.e., it was set to the relative value of 1.0 for both solar cells at the beginning of the measurements. Both solar cells are comparable in terms of design, material and power. Both solar cells have been artificially illuminated for in each case six hours, in each case interrupted by a six-hour time period in darkness. This should simulate the day/night rhythm, shortened in time. The illumination corresponded in terms of intensity and spectrum to real illumination by sunlight, for example.

The first solar cell was connected to a conventional regulation device for operating the solar cell at the maximum power point, i.e., a so-called "maximum power point tracking regulation device", throughout the measurement time period of 100 hours (approximately 8 day/night cycles). In particular, the solar cell was also connected to the mentioned regulation device or "loaded" during the dark periods.

This resulted in a considerable degradation of the efficiency of the solar cell under investigation. At the end of the 100-hour measurement time period, the efficiency of the solar cell was now only approximately a quarter of the value at the beginning of the investigations.

The second solar cell was disconnected from the "maximum power point tracking regulation device" during the time periods during which the cell was in darkness (8×6 hours). Here too, firstly a certain degradation of the cell efficiency can be observed during the light phases and secondly a certain degradation of the efficiency can be observed during the dark times. However, the degradation was much less than the first solar cell which was permanently connected to the regulation device. At the end of the 100-hour measurement time period, the efficiency of the solar cell was even so still approximately three-quarters of the value at the beginning of the investigations.

The disconnection of a photovoltaic module having a perovskite solar cell from the MPPT regulation device during darkness (or weak light) can therefore diminish the degradation of the perovskite solar cell, possibly even completely eliminate it or at least limit it.

LIST OF REFERENCE SYMBOLS 1 photovoltaic device
2 electromagnetic radiation
10 photovoltaic module
11 perovskite solar cell
111 front contact
112 rear contact
20 regulation device
30 switch
301 first position
302 second position
303 third position
51 x axis
52 y axis
53 efficiency of a first perovskite solar cell
54 efficiency of a second perovskite solar cell

The invention claimed is:

1. A method comprising:
operating, at least temporarily, a photovoltaic device comprising a photovoltaic module at a maximum power point by a maximum power point tracking regulation device connected to the photovoltaic module, with the photovoltaic module having at least one perovskite solar cell,
wherein a withdrawal of electrical energy is interrupted when an irradiance of an electromagnetic radiation impinging on the photovoltaic module falls below a predetermined threshold value,
wherein, when the irradiance falls below the predetermined threshold value, the photovoltaic module is electrically decoupled from the maximum power point tracking regulation device by a transistor, and
wherein the predetermined threshold value is in a range of between 2 $W/m^2$ and 20 $W/m^2$,
wherein, when the irradiance exceeds the predetermined threshold value, the photovoltaic module is electrically recoupled to the maximum power point tracking regulation device by the transistor.

2. The method as claimed in claim 1,
wherein, when the irradiance falls below the predetermined threshold value, the photovoltaic module is short-circuited.

3. The method as claimed in claim 1,
wherein a photocurrent generated by the photovoltaic module is used as a measure of the irradiance of the electromagnetic radiation impinging on the photovoltaic module.

4. The method as claimed in claim 1,
wherein the irradiance of the electromagnetic radiation impinging on the photovoltaic module is determined by impedance spectroscopy at one or more perovskite solar cells of the photovoltaic module.

5. The method as claimed in claim 1,
wherein the photovoltaic module has an additional photoelectric cell, and the irradiance of the electromagnetic radiation impinging on the photovoltaic module is determined by the additional photoelectric cell.

6. The method as claimed in claim 5,
wherein the irradiance is determined by a photocurrent generated by the additional photoelectric cell.

7. The method as claimed in claim 1,
wherein the irradiance of the electromagnetic radiation impinging on the photovoltaic module is estimated on the basis of meteorological data.

8. The method as claimed in claim 1,
wherein the maximum power point tracking regulation device is an inverter, or a microinverter, assigned to the photovoltaic module.

9. The method as claimed in claim 1,
wherein the maximum power point tracking regulation device is a power optimizer assigned to the photovoltaic module.

10. The method as claimed in claim 1,
wherein the predetermined threshold value is in the range of between 5 $W/m^2$ and 15 $W/m^2$.

11. The method as claimed in claim 1,
wherein the predetermined threshold value is 10 $W/m^2$.

* * * * *